US006545419B2

(12) United States Patent
Vella (10) Patent No.: US 6,545,419 B2
(45) Date of Patent: Apr. 8, 2003

(54) DOUBLE CHAMBER ION IMPLANTATION SYSTEM (75) Inventor: Michael C. Vella, San Leandro, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/800,539

(22) Filed: Mar. 7, 2001

(65) Prior Publication Data

US 2002/0125829 A1 Sep. 12, 2002

(51) Int. Cl.$^7$ .................................................. H01J 7/24
(52) U.S. Cl. .............................. 315/111.21; 315/111.31; 315/111.41; 315/111.71; 315/85; 315/111.91; 250/423 R; 250/423 F; 313/363.1; 313/362.1
(58) Field of Search ............................. 315/85, 111.21, 315/111.31, 111.41, 111.61, 111.71, 111.81, 111.91; 250/423 R, 423 F, 427, 496.1, 281; 313/363.1, 362.1, 231.31

(56) References Cited

U.S. PATENT DOCUMENTS

| | | | |
|---|---|---|---|
| 4,739,169 A | * 4/1988 | Kurosawa et al. | ...... 250/423 R |
| 5,107,170 A | * 4/1992 | Ishikawa et al. | ......... 313/362.1 |
| 5,315,121 A | * 5/1994 | Kluge et al. | ............ 250/423 R |
| 5,520,538 A |   5/1996 | Muka | .......................... 432/205 |
| 5,663,488 A |   9/1997 | Wang et al. | ................ 73/23.25 |
| 6,084,240 A |   7/2000 | Lin et al. | .................. 250/443.1 |
| 6,184,624 B1 | * 2/2001 | Inouchi | ................... 315/111.81 |
| 6,297,594 B1 | * 10/2001 | Sakai et al. | ............. 315/111.41 |

FOREIGN PATENT DOCUMENTS

JP        10-163123        6/1998

OTHER PUBLICATIONS

U.S. patent application Ser. No. 09/596,828.

* cited by examiner

Primary Examiner—Don Wong
Assistant Examiner—Tuyet T. Vo
(74) Attorney, Agent, or Firm—Margaret Chappuis; William Ryann (57) ABSTRACT An improved double chamber ion source comprising a plasma generating chamber, a charge exchange chamber and a divider structure therebetween. The charge exchange chamber includes magnetic shielding material to reduce exposure of interior components to magnetic field lines externally generated. The double compartment ion source further comprises inclusion of a heat shield and/or a cooling system to overcome deleterious effects caused by increased temperature in the plasma generating chamber. The divider structure has a plurality of apertures having a configuration to reduce surface area on the divider structure in the charge exchange chamber.

37 Claims, 8 Drawing Sheets

DOUBLE CHAMBER ION IMPLANTATION SYSTEM

GOVERNMENT RIGHTS IN INVENTION

Some aspects of this invention were made in the performance of U.S. Government Contract No. DE-AC03-76SF00098. The U. S. Government has certain rights in the invention hereof.

BACKGROUND OF THE INVENTION

1. Field of the Invention

The present invention relates to an ion source system, and more particularly, to an improved double chamber ion source that effectively provides heavy gas molecular ions through charge exchange.

2. Description of the Related Art

Numerous semiconductor manufacturing processes employ ion implantation for forming a p-n junction by adding dopants (impurities), such as boron (B) and phosphorus (P) to a semiconductor substrate. Ion implantation makes it possible to accurately control the concentration and depth of impurities to be diffused into a target spot on the semiconductor substrate.

Typically, an ion implanter includes an ion source that ionizes an atom or molecule of the material to be implanted. The generated ions are accelerated to form an ion beam that is directed toward a target, such as a silicon chip or wafer, and impacts a desired area or pattern on the target. The entire operation is carried out in a high vacuum.

The trend in semiconductor devices is to become smaller and thinner. As such, these smaller and thinner requirements challenge the ability of present systems to produce high dose ion beams with the low energy required to implant a high concentration of ions at a shallow depth in the semiconductor device.

Ion current (current density x area) and beam energy are the fundamental process variables for the implant step. Ion dose and implant range are the resultant device variables. Ion dose relates to the concentration of implanted ions in a semiconductor material. Moreover, the energy of the ion beam determines the depth of the implanted ions before the activation anneal step. The dose rate and, therefore, the process time is proportional to the ion current. Ideally, ion dose rate and beam energy would be independent process variables. This is somewhat true for high energy beams used for deep implants. However, low energy ion beams that are used for shallow implants, but, for standard dopant atomic ions at low beam energies, have ion currents that are constrained by physics limitations associated with extraction and transport losses.

Present ion implanters operate best at energies from about 10 keV to about 2 MeV. Shallower implant of ions will require similar beam currents as present implanters, but at much lower energies, e.g., from about 2 keV down to hundreds of eV. However, as beam energy decreases to accommodate thinner devices, beam transport of standard ions, defined as dopants, such as boron ($B^+$), arsenic ($As^+$) and phosphorus ($P^+$), becomes inefficient due to beam space charge. Beam space charge may be defined as the repelling of like charges in the ion beam causing an expansion of the ion beam during transport to the target. As a result, beam transmission is greatly reduced when the energy level is reduced.

The possibility of producing useful currents of a heavy gas phase molecular ion offers significant advantages over ion source material presently used in implanters. For example, using the heavy gas molecular ion, decaborane ion ($B_{10}H_{14}^+$), which has ten boron atoms has advantages for low energy, high current dopant beam transport. First, the energy for each individual boron nucleus is one tenth the energy of the ion, making it possible to extract and transport at approximately ten times the beam energy of boron ions. For example, a 10 keV beam of $B_{10}H_{14}^+$ would deliver dopant at less than 1 keV per boron atom. Second, the dopant nucleon current is ten times the ion current. As such, only about 1 mA of $B_{10}H_{14}^+$ is needed to deliver 10 mA of boron.

Thus, it would be advantageous to provide an ion source that produces heavy ions with multiple dopant atoms per ion, at a sufficient dose (current density) to be effective as an ion in an implanter system, especially for shallow depths.

However, attempts to produce ions of heavy dopant molecules in standard single ion sources have generally been unsuccessful. Several mechanisms can be present in single chamber sources that tend to breakup the large molecules, for example, collisions with energetic electrons, collisions with hot gas particles, contact with hot components such as filament or walls, plasma radiation, and filament radiation. Each of these can cause heavy molecules to break apart before they are ionized and/or implanted on the target substrate. Furthermore, even if the heavy molecule is not disassociated, charge transfer may occur in the ion beam thereby neutralizing the ion.

Charge transfer or electron charge exchange, is a result of collisions between a neutral particle and a charged ion and is considered a loss mechanism in ion beam systems. The simplest kind of charge transfer involves a collision between a neutral particle and a singly charged ion:

where A, B denote neutral particles in the ground state, and the superscript "+" indicates a single positive charge state. In this case, ion $B^+$ is created by an electron transfer from atom B to ion $A^+$.

Charge transfer can cause significantly different energy patterns in the ion beam dependent upon the region wherein charge transfer occurs. For instance, transfer product ions formed in the acceleration gap of an ion implanter experience less than full acceleration potential, and thus differ in energy from ions accelerated through the full gap. As such, charge transfer is usually undesirable because it reduces the current density of the desired ion at the desired impact energy.

Accordingly, it would be a significant advance in the art of ion implantation to provide an ion source that generates heavy gas molecular ions through a charge transfer mechanism at a sufficient current density to be effective in an implanter system, while eliminating or significantly reducing mechanisms present in standard plasma sources that breakup heavy molecules and/or molecular ions.

SUMMARY OF THE INVENTION

It is therefore a principal object of the present invention to provide an improved charge exchange molecular ion source.

Another object of the present invention is to provide an ion source system that provides a stream of ions having sufficient density to effectively coat a target substrate.

Still another object of the present invention is to provide a high energy ion beam that provides shallow implantation of heavy molecular ions.

Yet another object of the present invention provides heavy gas molecules at a sufficient current density to be effective in an implanter system.

A further object of the present invention is to improve the transport efficiency for a low energy ion beam for shallow junction implant by reducing the beam losses caused by beam space charge.

These and further objects are accomplished by improved ion sources disclosed herein.

One aspect of the present invention relates generally to an ion source for an implantation system that utilizes charge transfer to enhance production of a desired molecular ion species. The ion source contains a minimum of two regions separated by a physical barrier and utilizes charge exchange for production of a desired molecular ion species. The physical barrier serves to reduce the effect of mechanisms that are destructive for heavy molecules and ions, such as, collisions with energetic electrons, collisions with hot gas particles, contact with hot components such as filament or walls, thermal energy transfer, plasma radiation, and filament radiation. The barrier has at least one aperture that allows ions to flow from the plasma chamber into the charge transfer chamber. The barrier also serves to inhibit destructive mechanisms.

The essential elements of the present invention include at least one plasma chamber for production of ions of a first species, a divider structure, and at least one charge exchange region where ions of the first species, generated in the plasma chamber, undergo charge exchange or transfer with a reactant atom or molecule to produce ions of a second species.

Another aspect of the present invention provides for an ion source comprising at least one plasma generating chamber having a plasma generating means for generating ions. Adjacent to the plasma generating chamber is at least one charge exchange chamber, wherein a molecular species is ionized by electron transfer from a first ionized species extracted from the plasma generating chamber. The charge exchange chamber further comprises a magnetic shield to shield the second ion species, generated therein, from an exterior magnetic field. This embodiment may further comprise means to cool the magnetic shield. A magnetic shield can be created by placement of magnetic material, such as, iron, or, by electrical means, such as an electrical circuit that creates a magnetic field to modify the local magnetic field from the plasma source magnet.

Yet another aspect of the present invention provides for an ion source comprising at least one plasma generating chamber and at least one charge exchange chamber, the charge exchange chamber is separated from the plasma generating chamber by a divider structure having a plurality of apertures for introducing ions generated in the plasma generating chamber into the charge exchange chamber, the apertures having a configuration that reduces back-migration of ions and gas from the charge exchange chamber to the plasma generating chamber.

A further aspect of the present invention provides for an ion source comprising at least one plasma generating chamber and at least one charge exchange chamber, the charge exchange chamber is separated from the plasma generating chamber by a divider structure having at least one aperture. A heat shield is positioned between the charge exchange chamber and plasma generating chamber to reduce heat conduction from the plasma generating chamber.

A still further aspect of the present invention provides for an ion source comprising at least one plasma generating chamber and at least one charge exchange chamber, the charge exchange chamber is separated from the plasma generating chamber by a divider structure having at least one aperture for emission of ions generated in the plasma generating chamber into the charge exchange chamber. The plasma chamber farther comprises at least one magnet oriented to establish magnetic field components transverse to the direction of travel of ions from the ion source region to the charge exchange region. The magnet may further comprise a yoke to return magnetic flux and minimize magnetic flux leakage into the charge exchange chamber.

Still another aspect of the present invention provides for an ion source comprising at least one plasma generating chamber and at least one charge exchange chamber, the charge exchange chamber is separated from the plasma generating chamber by a divider structure having at least one aperture for emission of ions generated in the plasma generating chamber into the charge exchange chamber, the plasma chamber further comprising at least one magnet oriented to establish a magnetic field having field components in the direction of travel of ions from the plasma generating chamber to the charge exchange chamber, thereby increasing the ion transfer efficiency from the plasma chamber into the charge exchange chamber.

Other aspects, features and embodiments of the present invention will be more fully apparent from the ensuing disclosure and appended claims.

DETAILED DESCRIPTION OF THE INVENTION AND PREFERRED EMBODIMENTS THEREOF

The present invention provides for a double region ion source to produce a resonant charge exchange between an ion A+ and a neutral heavy molecule, MOL:

$A^+ + \text{MOL} \rightarrow A + \text{MOL}^+$

The heavy molecules MOL are ionized by charge exchange with the ions $A^+$. The ions $A^+$ are first created in a plasma generating region in the ion source of the present invention. The ions $A^+$ flow into a charge exchange region where electron transfer. As result of charge exchange, molecular ions are produced that are extracted and accelerated to form the output of the improved ion source of the present invention. In the present context, it should be understood that the charge exchange process can create a gas phase ion from any material particle, including atoms, molecules, cluster or any other group of multiple nuclei.

The ensuing discussion involves the formation of positive ions for implanting, but it should be recognized that similar processes occur for producing negatively charged atoms, molecules, clusters and other aggregates. Additionally, although decaborane is used as an applicable heavy molecule to be ionized for implantation, other commercially available molecules with dopant atoms will be compatible with the practice of the present invention.

Figure 1:
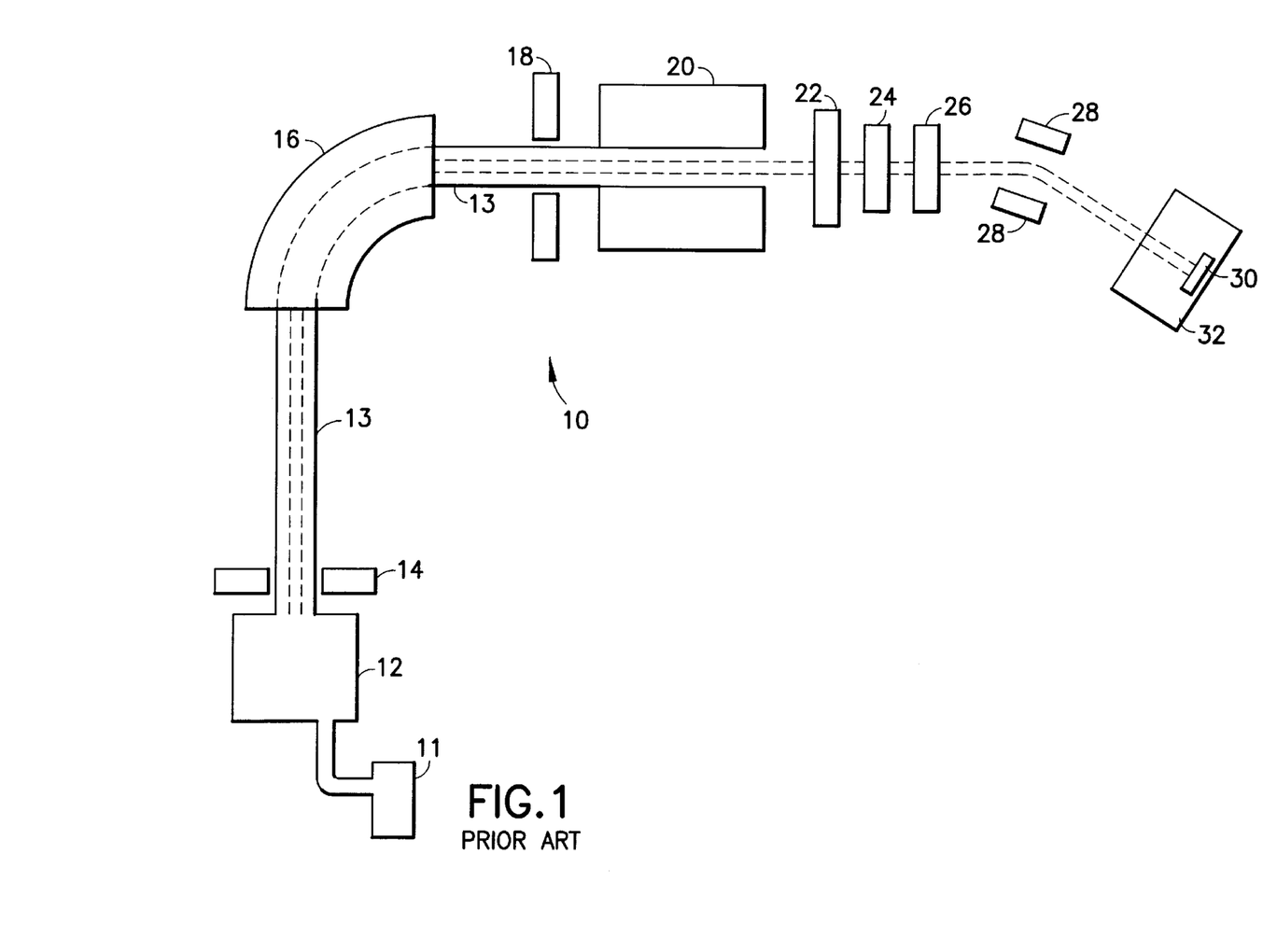
FIG. 1 is a cross-sectional view showing different components of an ion implanter of the prior art.

Turning now to the drawings, FIG. 1 depicts an ion implanter of the prior art, shown generally at 10, which typically includes an ion source 12 wherein ions are generated. The ions are drawn by extracting electrodes 14 and their mass is analyzed by a separating electromagnet 16. The ions are separated by apertures 18 and may be further accelerated or decelerated by accelerators 20 to a final energy. A beam of ions is converged on a sample 30, positioned in a target chamber 32, by quadrupole lens 22 and scanned by scanning electrodes 24 and 26 to uniformly distribute the ion beam on the target 30. Deflection electrodes 28 are designed to deflect the ion beam in order to eliminate uncharged particles caused by collision with residual gas. It should be noted that any of components 18, 20, 22, 24, 26, and 28 may be optional for any given implanter.

Figure 2:
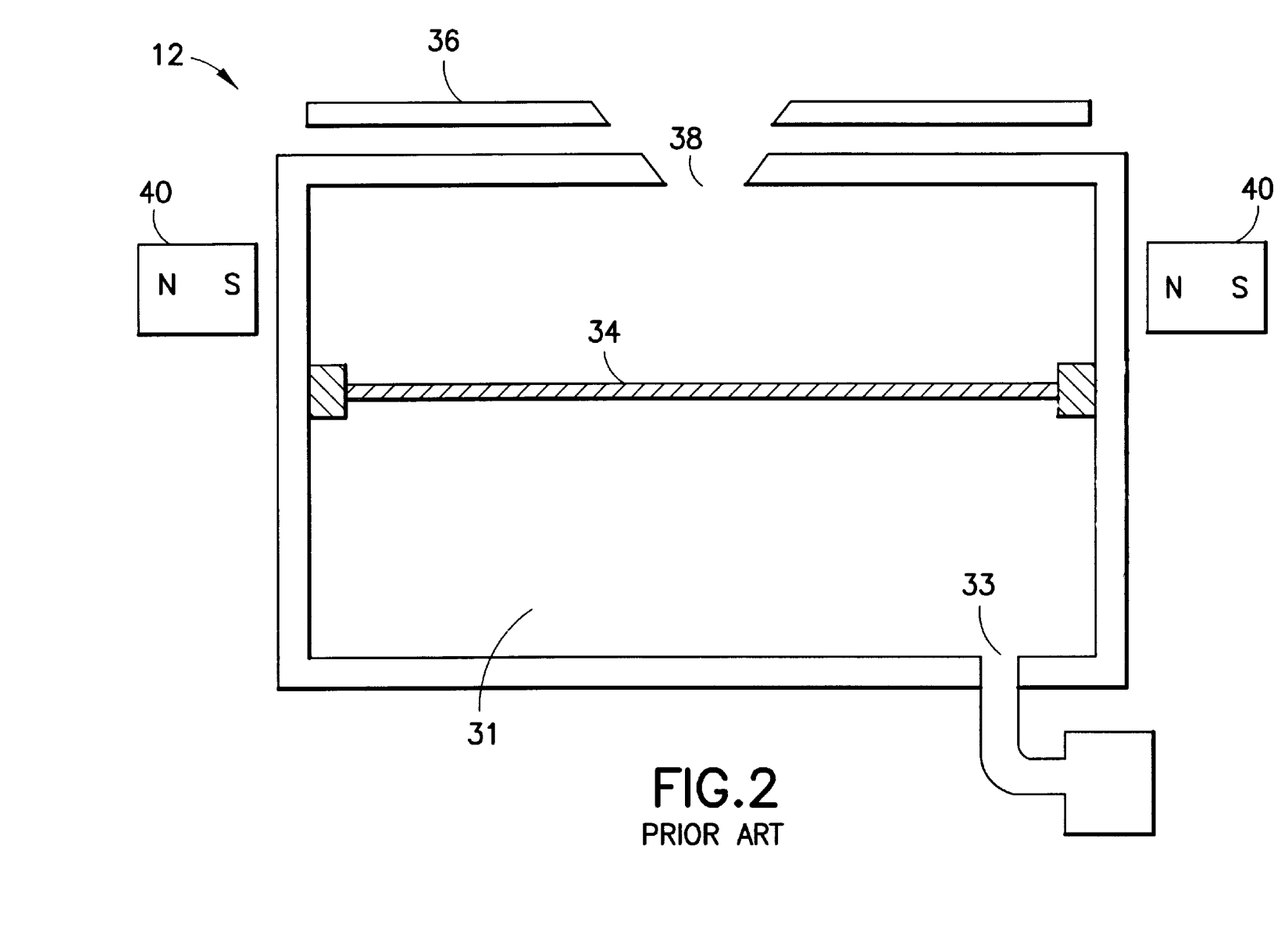
FIG. 2 is a cross-sectional view showing a Freeman-type ion source of the prior art.

FIG. 2 shows a single chamber Freeman type ion source 12 of the prior art. The Freeman type ion source generates plasma by emitting thermoelectrons from a rod-shaped cathode filament 34 attached in an interior chamber 31 and positioned approximately parallel with respect to the plane of the extraction slit 38. Thermoelectrons interact with ionizable source material introduced at gas inline 33. The gas introduced into the interior chamber is ionized primarily by electron impact, although charge exchange and other mechanisms play a role. Ions are accelerated when they fall into the region of the extraction gap 38 by electric fields created by bias of the extraction electrode 36 relative to the plasma chamber.

A nonfluctuating magnetic field is generated parallel to the filament 34 by permanent magnets 40, although the source magnetic field could also be generated by electric currents in a coil. The magnetic field generated by the alignment of the magnets is orthogonal to the moving direction of the ions as extracted from the ion source. The nonfluctuating magnetic field together with the field generated by the current flowing through the cathode filament 34 influence the moving direction of the electrons after being emitted from the filament. Additionally, generated ions must traverse through the magnetic field to be accelerated at the extraction aperture, and are subjected to neutralizing collisions with the walls of the interior ionization chamber adjacent to the extraction slit. These neutralizing collisions decrease ionization efficiency. Moreover, the orientation of the magnetic field, orthogonal to the direction of the emitting ions, causes a spiral or turbulent trajectory that tends to keep the ions from exiting the chamber, thereby reducing the current density of the ion beam.

Figure 3:
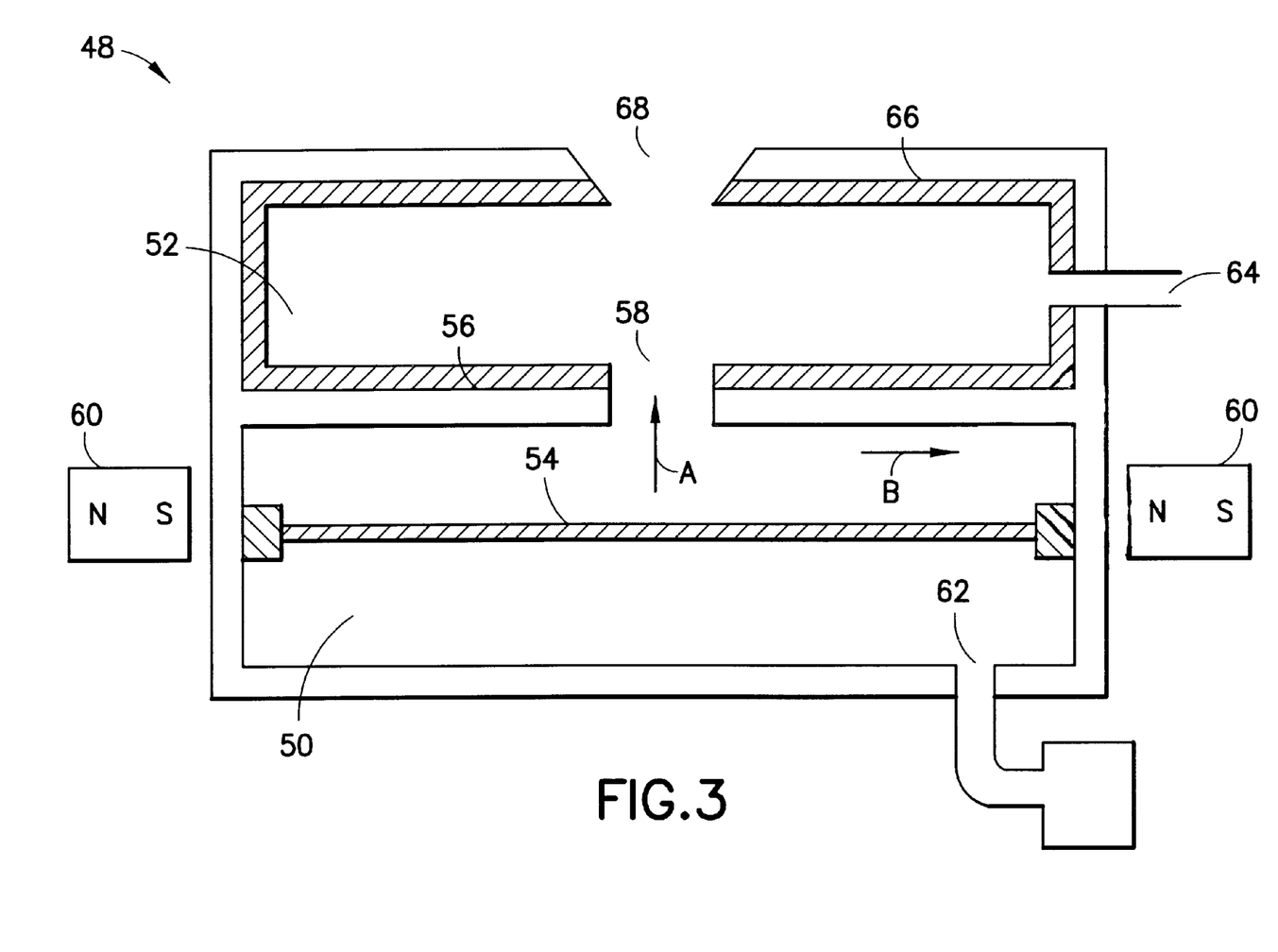
FIG. 3 is a cross-sectional view showing a modified Freeman-type ion source having a double chamber configuration of the present invention.

FIG. 3 shows a Freeman-type ion source modified according to one aspect of the present invention. Ion source 48 comprises two chambers including, a plasma generating chamber 50 wherein a first species ion is generated and a charge exchange chamber 52 wherein charge transfer occurs generating a second species ion. Separating the plasma generating chamber and charge exchange chamber is positioned a divider structure 56 having at least one apertured slit 58 therein to provide a communication channel between the two chambers. The divider 56 may be constructed of multiple layers to reduce heat transfer between the chambers.

Figure 3A:
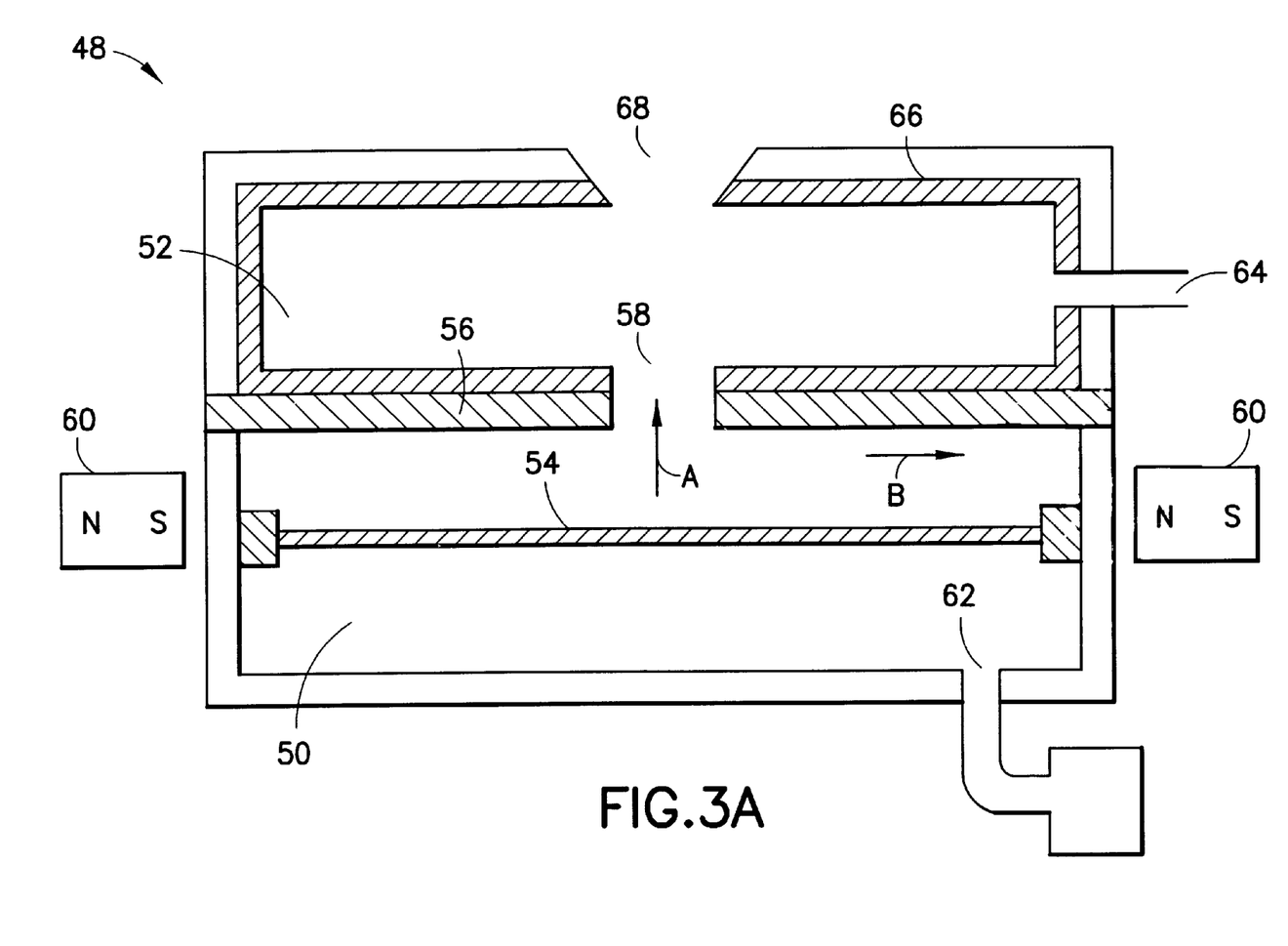
FIG. 3A is a cross-sectional view showing a modified Freeman-type ion source having a double chamber configuration with an electrical insulating material separating the chambers.

The chamber divider 56 serves to maximize the molecular gas density and to isolate molecular gas from plasma radiation, primary electrons, and heat in the plasma generating chamber 50, thereby minimizing non-preferred interactions and enhancing the charge transfer between the plasma generating chamber 50 and charge exchange chamber 52 The chamber divider 56 may further comprise an electrically insulating material to electrically separate the two chambers as shown in FIG. 3A. This allows the ion source to be operated in a common mode by connect the two chambers with a wire as shown in FIG. 3, or with the charge exchange chamber electrically isolated or biased with respect to the plasma chamber.

The plasma generating chamber includes a filament 54 positioned axially with respect to the chamber divider 56. Permanent magnets 60 are positioned parallel to the side walls of the plasma generating chamber thereby creating a magnetic field B orthogonal to the direction of emitted ions along path A. Alternatively, electromagnets can also be used for the source magnetic field.

It is believed that as charge transfer occurs in the charge exchange chamber, the newly created ions moving towards the extraction aperture 68 are subject to the magnetic field created around the plasma generating chamber. Moreover, when ions move through the volume of the charge exchange chamber to the extraction aperture 68, they have to traverse the magnetic field and the moving ions experience the natural gyro motion of a charged particle in a magnetic field. By the time the ions reach the extraction slit 68, they have significant non-orthogonal momentum. As a result, the charged particle mobility is reduced in the extraction direction with a concomitant ion current density.

To overcome the above problems, a layer of magnetic shielding material is positioned in at least a portion of the interior of the charge exchange chamber 52 for the purpose of shielding the chamber from the generated magnetic field around and in the plasma generating chamber. Advantageously, the inclusion of magnetic shielding substantially reduces the negative effects of the magnetic field and increases the rate at which ions are extracted through aperture 68.

The magnetic shield may be fabricated from any material that provides a low reluctance magnetic path for the interfering magnetic field, attracts magnetic flux lines to it and has a small coercive field. Preferably, a ferromagnetic metal is used, and more preferably an alloy comprising ⅔ iron and ⅓ nickel.

Static magnetic shield effectiveness is directly proportional to shield thickness because the shield's reluctance to magnetic flux is inversely proportional to it thickness. Thus, the thickness of the shielding material will be dependent upon the magnetic field intensity and one skilled in the art will be able to effectively determine the applicable thickness. The degree of shielding achieved by a given total thickness of material can be increased by dividing it into two or more sheets separated by at least the thickness of the material. Also, different permeability materials may be used in layers wherein the material with the lowest permeability is located closest to the field source. Additionally, small permanent or electro magnets may be used to locally cancel the magnetic field from the plasma source within the charge exchange chamber.

The following describes the operation of this embodiment. A reactant plasma forming gas is introduced into plasma generating chamber 50. This gas could be introduced at gas inlet 62, such as hydrogen gas, or, it could enter from the charge exchange chamber via aperture 58. A heavy gas molecule MOL, such as decaborane ($B_{10}H_{14}$), is introduced into the charge exchange chamber 52 through gas feed source 64. Energetic primary electrons generated by filament 54 in the plasma generating chamber 50 generate first species $H^+$ ions. These ions drift through aperture 58 in chamber divider 56 into the charge transfer chamber for charge exchange with the $B_{10}H_{14}$. As a result of charge exchange, molecular ions containing multiple dopant atoms, $B_xH_y^+$, are produced. The $B_xH_y^+$ ions are extracted at extraction aperture 68 and are accelerated to form a $B_xH_y^+$ ion beam.

Advantageously, with the addition of the magnetic shield to the double compartment ion source of FIG. 3, external magnetic fields are directed around the charge exchange chamber. Reducing the magnetic flux that ions must traverse increases ion current density at the extraction aperture 68, thereby increasing ion current density in the ion beam impacting the target substrate.

Figure 4:
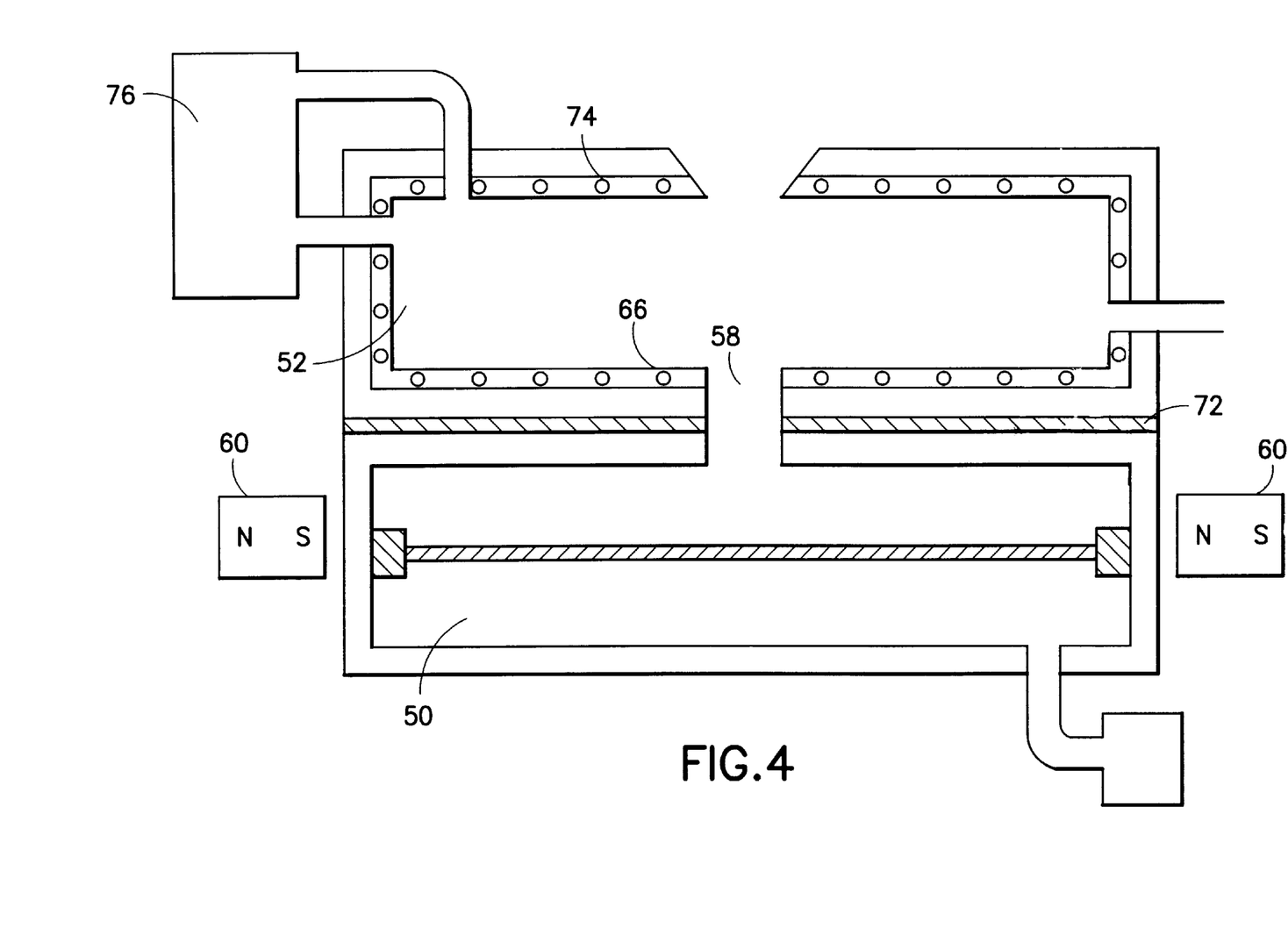
FIG. 4 is a cross-sectional view showing a heat shielding plate positioned between the plasma generating chamber and the charge exchange chamber.

To assist in the demagnetizing of the charge exchange chamber, this embodiment may further comprise a system for cooling the magnetic shielding material, as shown in FIG. 4. The plasma generated in the plasma generating chamber may create sufficient heat to cause the magnetic shielding material to be demagnetized. To keep the magnetic shielding cool, a heat shield 72 may be interposed between the magnetic shielding lining 66 and the plasma generating chamber 50.

The inclusion of a heat shield between the charge exchange chamber and the plasma generating chamber provides the additional benefit of reducing the temperature of the wall between the chambers thereby reducing thermal consumption of fuel introduced into the charge exchange chamber for ionization. Useless fuel consumption is expensive, not only directly because of the high cost of the fuel, but also because refueling of the ion source requires the instrument to be taken off-line, which is not cost effective. Also, residue particles can contaminate the beamline and reduce service intervals.

The heat shield positioned between the two chambers may be fabricated from any heat-insulating material that reduces heat flow, including metal, glass fibers, asbestos fibers, carbon and graphite fibers, insulating firebrick material and the like. The thickness of the heat shield layer will be dependent on the temperature generated in the plasma generating chamber and may be determined by one skilled in the art.

It is further contemplated to cool the magnetic shielding lining with a cooling system that exploits principles of heat transference to sufficiently cool the magnetic shielding material and minimize the possibility of demagnetization. Methods of cooling may include, without limitation, cooling by heat transfer to a solid, liquid or gaseous media which is naturally or artificially colder, wherein the lower temperature of the solid, liquid or gas media stems from radiation, sensible- or latent-heat physical effects, endothermic chemical effects, thermoelectric effects, and/or magnetic effects. Effects such as cold streams, melting ice, and sublimating solid carbon dioxide are also included. Further, the cooling devices disclosed in copending U.S. patent application Ser. No. 09/596,828, entitled "THERMAL REGULATION OF AN ION IMPLANTATION SYSTEM" the contents of which are herein incorporated for all purposes made be utilized.

As shown in FIG. 4, magnetic shielding layer 66 includes a cooling system that acts as a heat sink to accept heat transferred from the plasma generating chamber thereby cooling the magnetic shielding layer. The cooling system includes a piping system for transporting a heat-absorbing fluid that accepts heat for transference to an outside source.

Figure 5:
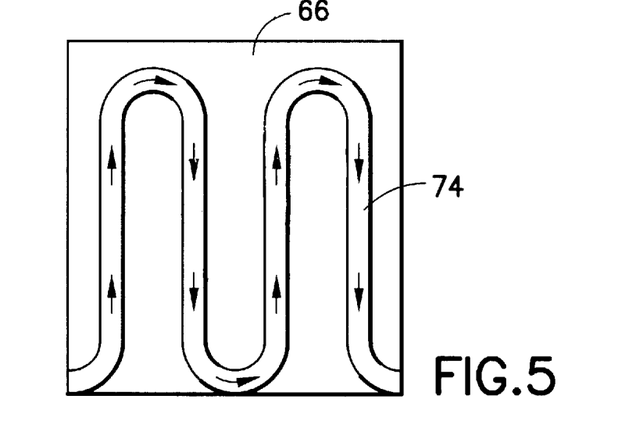
FIG. 5 illustrates a section of a cooling system incorporated into the magnetic shielding liner in the charge exchange chamber.

FIG. 5 illustrates a section of layer 66 having included therein piping 74 for circulating a flow of heat-absorbing fluid. The choice of the heat-absorbing fluid depends upon the temperature range in which it must operate. The fluid, having heat-absorption capabilities, is moved through the piping system to accept heat and then is circulated to a vapor-compression cooling system 76 for cooling by contact with an evaporator surface therein. The heat-absorbing fluid may be recirculated continuously until the ion source has reached an acceptable temperature.

Figure 6:
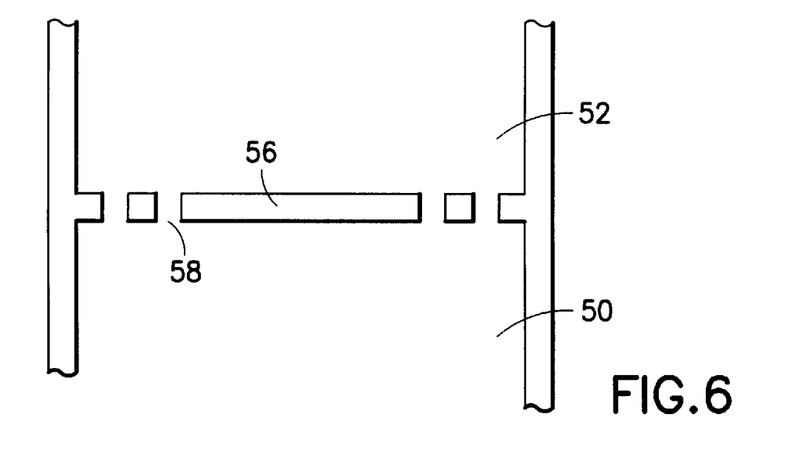
FIG. 6 illustrates a preferred embodiment for placement of apertures in the chamber divider.

In another aspect of the present invention, the divider 56 shown in FIG. 6, may further comprise a plurality of apertures located optimally along the divider. Preferably, the apertures are positioned at or near the ends of the plasma chamber leaving the center section of the divider essentially devoid of apertures. Advantageously, it has been found by the inventors that increasing the area for transference of ions in the divider near the end of the filament and plasma chamber wall while reducing or eliminating a transference area near the center of the divider between the chambers increase the ratio of forward ions to reverse gas flux.

Figure 6A:
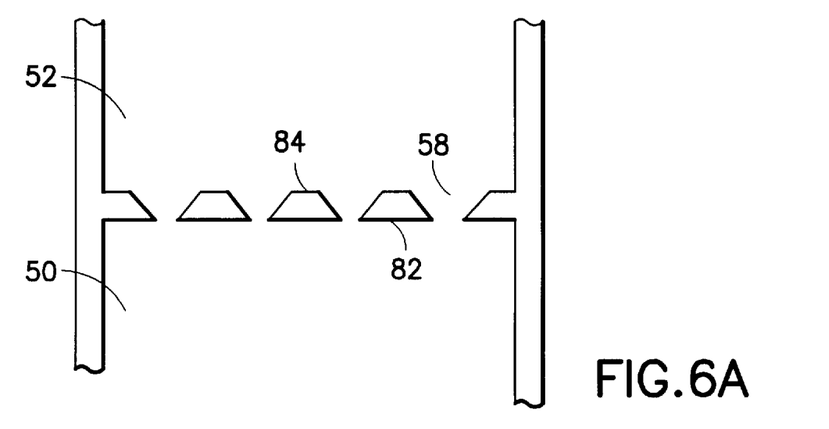
FIG. 6A illustrates a plurality of apertures having a tapered protuberance configuration.

In the alternative, it is envisioned by the inventors to provide an aperture configuration to reduce ion loss in the charge exchange chamber by reducing the wall area of the divider on the charge exchange side as shown in FIG. 6A. This may be accomplished by configuring the apertures as tapered protuberances, having the wider opening 84 of the aperture positioned in the charge exchange chamber and the smaller tapering end 80 of the aperture on the plasma generating side.

Figure 7:
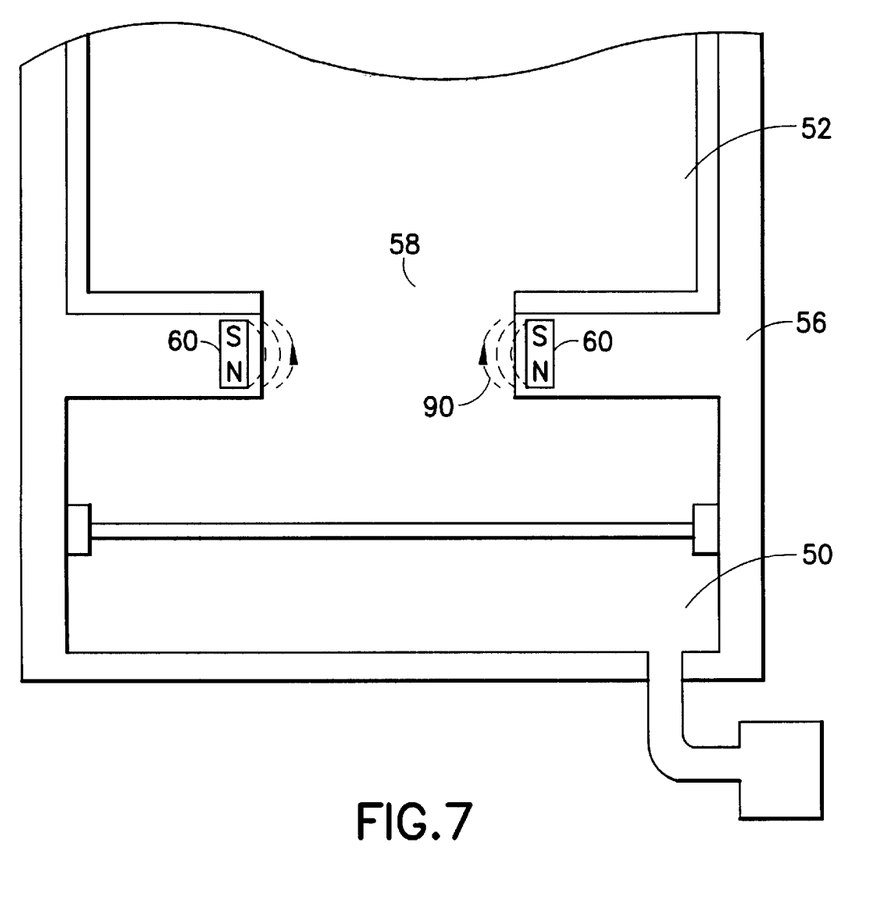
FIG. 7 is a cross-sectional view showing a modified orientation of permanent magnets positioned to increase movement of ions from the plasma generating chamber to the charge exchange chamber.

FIG. 7 illustrates a preferred arrangement of magnets positioned to provide a magnetic field having significant field components parallel to the extraction direction of the ions from the plasma generating chamber to the charge exchange chamber. As discussed hereinabove, the magnetic field generated by the placement of the magnets, as shown in FIG. 2 of the prior art, can influence migration of plasma ions and cause neutralizing collisions with the walls of the plasma generating chamber adjacent to the extraction slit thereby decreasing ionization efficiency. Furthermore, the orientation of the magnetic field, orthogonal to the direction of the emitting ions, causes a spiral or turbulent trajectory of the ions as they traverse the magnetic field, which tends to keep the ions from existing the chamber, thereby reducing the current density of the ion beam.

In FIG. 7, the plasma enhancement magnets 60 are arranged with their magnetic axes aligned parallel to the travel direction of the ions extracted through the aperture slit 58. Accordingly, the magnets generate magnetic field components, as illustrated by lines 90. The parallel magnetic field components help to reduce the deleterious effects of orthogonal magnetic fields and may limit the need for magnetic shielding because the power efficiency of the ion source is increased as measured by the ratio of extraction current density to arc power.

Figure 8:
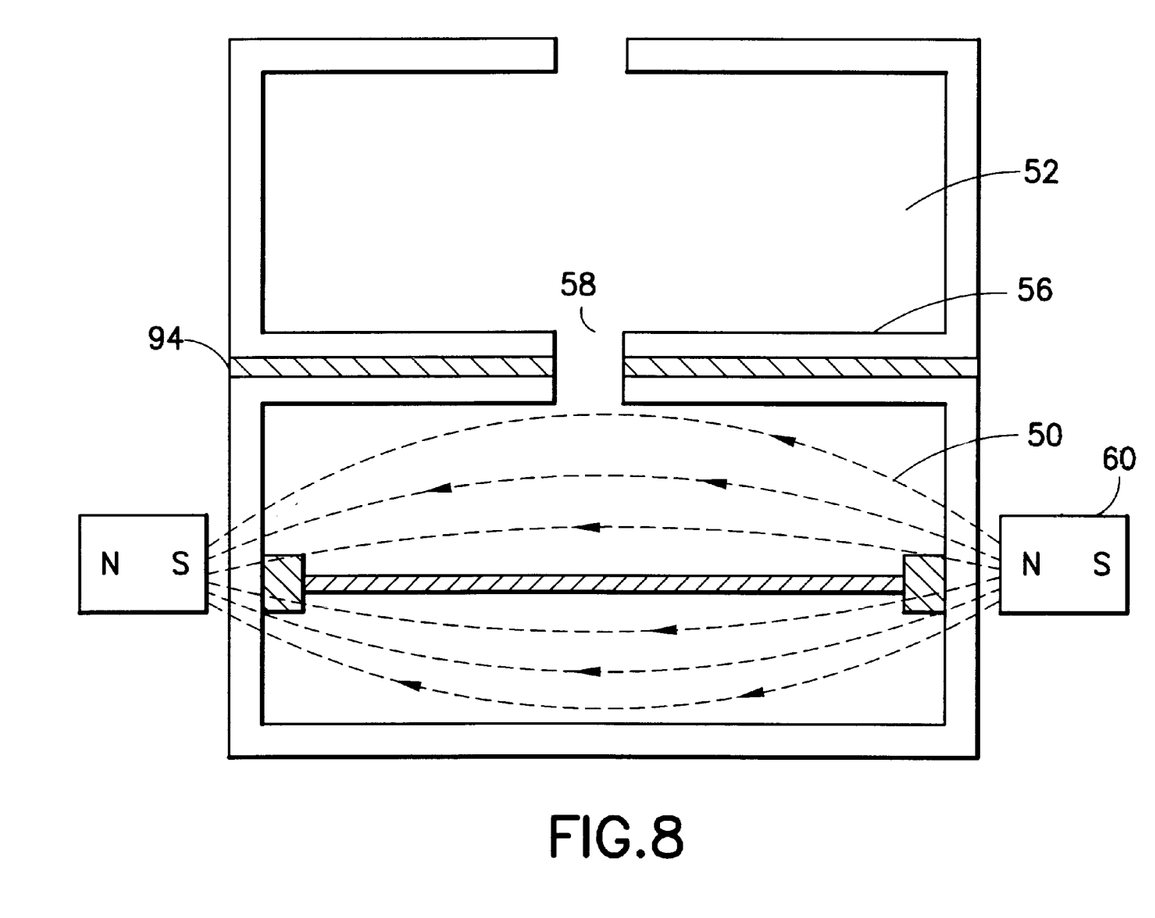
FIG. 8 is a cross-sectional view showing permanent magnets positioned adjacent to the plasma generating chamber and a magnetic barrier wall between the two chambers functioning as a magnetic shield/yoke

The problems associated with the orthogonal orientation of the magnetic field in relation to the moving direction of the emitting ions may be overcome by restricting the plasma source magnetic field. For example, an insert 94 in divider 56 made of magnetic material would act as a shield/yoke as shown in FIG. 8, enclosing the source magnetic field within. Permanent magnets 20 are aligned to produce magnetic field lines 92 that extend from one to the other. In this embodiment, the shield/yoke insert minimizes leakage of magnetic field lines by essentially capturing the magnetic flux and limiting the magnetic field components in the charge exchange chamber by retaining or redirecting the magnetic field in only the plasma generating chamber. As a result, interference with ion movement in the charge exchange region is greatly reduced.

Having described a preferred embodiment, it is to be understood that the description is for purposes of illustration only and that all modifications and alterations that come within the scope of the appended claims are intended to be included herein. For example, the principal of charge exchange in the double chamber ion source system of the present invention can be correspondingly applied in respect of other molecules. The example of decaborane involves positive ions, but similar processes occur for atoms and molecules that have negative charge species. Positive ions are more likely to be of interest for ion implant applications, and as such, were used as a non-limiting example.

Further, the double chamber ion source may comprise separate power sources to control temperatures in the separate chambers and to provide a temperature differential therebetween if required to cool electrons or ions in the charge exchange chamber. Additionally, the charge exchange chamber may be equipped with a ventilation system to relieve internal pressure due to the formation of gases within the chamber, such as hydrogen gas formed during the ionization of decaborane.

What is claimed is:

1. A ion source, comprising:
   at least one interior compartment for ionizing an ion source material; a filament for generating plasma; means for generating a magnetic field to affect contents of the interior compartment; and
   a magnetic shielding means positioned adjacent to the interior compartment to minimize effects of the magnetic field on surrounding regions.

2. The ion source according to claim 1 further comprising means to cool the magnetic shielding means.

3. The ion source according to claim 1 wherein the magnetic shielding means comprises an iron-nickel alloy.

4. The ion source according to claim 1 wherein the interior compartment is divided into two separate chambers comprising at least one plasma generating chamber for production of ions of a first species, and at least one charge exchange chamber where ions of the first species undergo charge exchange with a reactant atom or molecule to produce ions of a second species; and a divider positioned between the plasma generating chamber and the charge exchange chamber, the divider having at least one aperture for transmitting therethrough ions of the first species into the charge exchange chamber.

5. The ion source according to claim 4 wherein the magnetic shielding means is positioned in the charge exchange chamber to minimize the effects of the magnetic field in the charge exchange chamber.

6. The ion source according to claim 4 further comprising means to cool the magnetic shielding means.

7. The ion source according to claim 4 wherein the magnetic shielding means comprising an iron-nickel alloy.

8. The ion source according to claim 4 wherein the plasma generating chamber and the charge exchange chamber have independently controlled temperature regulating means.

9. The ion source according to claim 4 wherein the at least one aperture has a tapered protuberance configuration.

10. The ion source according to claim 9 wherein the apertures are positioned in the divider near the ends walls of the interior chamber and the center area of the divider is essentially devoid of apertures.

11. An ion source, comprising:
    an interior compartment divided into at least two chambers by at least one divider, the two chambers including:
       at least one plasma generating chamber for production of ions of a first species, and at least one charge exchange chamber wherein ions of the first species undergo charge exchange with a reactant atom or molecule to produce ions of a second species;
    the divider having at least one aperture for transmitting therethrough ions of the first species into the charge exchange chamber, the at least one aperture having a tapered protuberance configuration to minimize divider area in the charge exchange chamber; and the charge exchange chamber having disposed therein at least one extraction aperture.

12. The ion source according to claim 11 further comprising at least one heat shielding means positioned adjacent to the charge exchange chamber and between the charge exchange chamber and plasma generating chamber to reduce heat conduction from the plasma generating chamber.

13. The ion source according to claim 12 further comprising a magnetic shielding means positioned adjacent to the charge exchange chamber to minimize effects of external magnetic fields in the charge exchange chamber.

14. The ion source according to claim 13 further comprising means to cool the magnetic shielding means.

15. The ion source according to claim 11 further comprising a magnetic shielding means positioned adjacent to the charge exchange chamber to minimize effects of external magnetic fields in the charge exchange chamber.

16. The ion source according to claim 15 further comprising means to cool the magnetic shielding means.

17. An ion source, comprising:
    a plasma generating chamber with plasma generating means for generating ions from a ion source material, and a magnetic source positioned adjacent to the plasma generating chamber and oriented to establish a magnetic field having field components in the direction of exaction of generated ions from the plasma generating chamber to increase the power efficiency of the ions impacting the object wherein said plasma generating means is a filament.

18. The ion source according to claim 17 further comprising a magnetic shielding means positioned adjacent to at least a portion of the plasma generating chamber to minimize effects of external magnetic fields generated outside of the plasma generating chamber.

19. The ion source according to claim 17 wherein the magnetic shielding means comprises an iron-nickel alloy.

20. An ion source, comprising:
    an interior compartment divided into at least two chambers by at least one divider, the two chambers including:
       at least one plasma generating chamber having plasma generating means for generating ions of a first species from a first ion source material;
       at least one charge exchange chamber where ions of the first species undergo charge exchange with a reactant atom or molecule to produce ions of a second species;

at least one aperture in the at least one divider structure for transmitting therethrough ions of the first species into the charge exchange chamber; and at least one extraction aperture in the charge exchange chamber; and a magnetic source positioned adjacent to the plasma generating chamber and oriented to establish a magnetic field having field components in the direction of extraction of generated ions from the plasma generating chamber to increase the power efficiency of the ions transmitted through the at least one aperture of the physical divider into the charge exchange chamber.

21. The ion source according to claim 20 further comprising a magnetic shielding means positioned adjacent to at least a portion of the plasma generating chamber to minimize effects of external magnetic fields generated outside of the plasma generating chamber.

22. The ion source according to claim 21 further comprising means to cool the magnetic shielding means.

23. The ion source according to claim 21 wherein the magnetic shielding means comprises an iron-nickel alloy.

24. The ion source according to claim 21 wherein the at least one aperture has a tapered protuberance configuration to minimize surface area of the divider wall in the charge exchange chamber.

25. The ion source according to claim 24 further comprising a heat shield positioned adjacent to the charge exchange chamber and between the charge exchange chamber and plasma generating chamber to reduce heat conduction from the plasma generating chamber.

26. The ion source according to claim 21 further comprising a heat shield adjacent to the charge exchange chamber and between the charge exchange chamber and plasma generating chamber to reduce heat conduction from the plasma generating chamber.

27. An ion source, comprising:

an interior compartment divided into at least two chambers by at least one divider structure, the at least two chambers comprising:

at least one plasma generating chamber having plasma generating means for generating ions of a first species from a first ion source material;

at least one charge exchange chamber where ions of the first species undergo charge exchange with a reactant atom or molecule to produce ions of a second species;

at least one aperture in the at least one physical divider for transmitting therethrough ions of the first species into the charge exchange chamber; and at least one extraction aperture in the charge exchange chamber; and a magnetic source means positioned adjacent to the plasma generating chamber and oriented to establish a magnetic field having field components transverse to the direction of extraction of generated ions from the plasma generating chamber.

28. The ion source according to claim 27 further comprising a heat shield adjacent to the charge exchange chamber and between the charge exchange chamber and plasma generating chamber to reduce heat conduction from the plasma generating chamber.

29. The ion source according to claim 27 further comprising a magnetic shielding means positioned in the divider to minimize effects of external magnetic fields generated outside of the plasma generating chamber.

30. The ion source according to claim 29 further comprising means to cool the magnetic shielding means.

31. The ion source according to claim 29 wherein the magnetic shielding means comprises an iron-nickel alloy.

32. The ion source according to claim 29 wherein the at least one aperture is at least two apertures positioned near away from the center of the divider.

33. The ion source according to claim 32 further comprising a heat shield positioned adjacent to the charge exchange chamber and between the charge exchange chamber and plasma generating chamber to reduce heat conduction from the plasma generating chamber.

34. A method of producing ions by charge exchange, comprising:

producing ions of a first species in a plasma generating chamber;

introducing the produced ions of the first species into a second region that is essentially separated form the plasma generating chamber excepting for at least one aperture in a divider therebetween, the second region containing a second species capable of being ionized for undergoing charge exchange with the ions of the first species to produce ions of the second species and an extraction aperture.

35. The method according to claim 34 further comprising the step of shielding the second region from an externally generated magnetic field.

36. The method according to claim 34 further comprising the step of insulating the second region from externally produced heat.

37. The method according to claim 34 further comprising the step of orienting a magnetic field around the plasma generating chamber to produce magnetic field lines having field components in the direction of ion movement between the plasma generating chamber and the second region.

* * * * *

UNITED STATES PATENT AND TRADEMARK OFFICE
CERTIFICATE OF CORRECTION

PATENT NO. : 6,545,419 B2
DATED : April 8, 2003
INVENTOR(S) : Michael C. Vella et al.

It is certified that error appears in the above-identified patent and that said Letters Patent is hereby corrected as shown below:

<u>Title page,</u>
Item [75], Inventor, please delete "Michael C. Vella, San Leandro, CA (US)" and substitute -- Michael C. Vella, San Leandro, CA (US), Robert L. Brown, Taos, NM (US) --

Signed and Sealed this

Sixteenth Day of March, 2004

JON W. DUDAS
*Acting Director of the United States Patent and Trademark Office*